US006501305B2

(12) United States Patent
Rincon-Mora et al.

(10) Patent No.: US 6,501,305 B2
(45) Date of Patent: Dec. 31, 2002

(54) BUFFER/DRIVER FOR LOW DROPOUT REGULATORS

(75) Inventors: Gabriel A. Rincon-Mora, Allen, TX (US); Richard K. Stair, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/007,921

(22) Filed: Dec. 7, 2001

(65) Prior Publication Data

US 2002/0079935 A1 Jun. 27, 2002

Related U.S. Application Data

(60) Provisional application No. 60/257,689, filed on Dec. 22, 2000.

(51) Int. Cl.[7] .................................................. H03K 3/00

(52) U.S. Cl. ........................................ 327/108; 327/434

(58) Field of Search ......................... 327/100, 108–112, 327/434, 436, 437; 330/252, 253

(56) References Cited

U.S. PATENT DOCUMENTS

| | | | | |
|---|---|---|---|---|
| 4,359,650 A | * | 11/1982 | Newcomb | 327/111 |
| 5,578,960 A | * | 11/1996 | Matsumura et al. | 327/538 |
| 6,362,609 B1 | * | 3/2002 | Gailhard | 327/111 |

* cited by examiner

*Primary Examiner*—Kenneth B. Wells
(74) *Attorney, Agent, or Firm*—Alan K. Stewart; W. James Brady, III; Frederick J. Telecky, Jr.

(57) ABSTRACT

The buffer/driver for low dropout regulators (LDO) uses a feedback amplifier with low output impedance to drive the gate of the pass device MP6 of the regulator. This effectively pushes the gate pole out to a higher frequency. The feedback amplifier is designed for very high slew rate and high bandwidth while running at very low quiescent current. The circuit enhances the LDO performance, stability, and slew rate.

10 Claims, 4 Drawing Sheets

BUFFER/DRIVER FOR LOW DROPOUT REGULATORS

This application claims priority under 35 USC §119 (e) (1) of provisional application number 60/257,689 filed Dec. 22, 2000.

FIELD OF THE INVENTION

This invention generally relates to electronics and more particularly to buffer circuits for low dropout regulators.

BACKGROUND OF THE INVENTION

In low voltage, low dropout linear voltage regulators (LDO), a large pass device (typically a FET) must be used to deliver high currents to a load. The size of this pass device results in a large parasitic capacitance seen from the gate of the device to AC ground. This capacitance must be charged and discharged as the load changes in order to keep the output voltage of the LDO constant. The performance of the LDO is therefore limited by how fast this capacitance can be charged and discharged (slew rate).

Additionally, the presence of the large parasitic capacitance results in a significant pole in the frequency response of the amplifier, which can make the amplifier more difficult to stabilize.

In most LDO amplifiers a source follower (or emitter follower) is used to drive the gate of the pass FET. Typical class A followers are slew rate limited in one direction by the biasing current source.

Prior art solutions to this problem typically involve using large amounts of quiescent current to decrease the output impedance of the driver (follower) and to push the gate pole to a higher frequency. Also, many other prior art designs achieve improved slew rate performance by increasing the bias current through the driver.

SUMMARY OF THE INVENTION

A buffer/driver for low dropout regulators (LDO) uses a feedback amplifier with low output impedance to drive the gate of the pass device of the regulator. This effectively pushes the gate pole out to a higher frequency. The feedback amplifier is designed for very high slew rate and high bandwidth while running at very low quiescent current. The circuit enhances the LDO performance, stability, and slew rate.

DETAILED DESCRIPTION OF PREFERRED EMBODIMENTS

The preferred embodiment described below uses a feedback amplifier with low output impedance to drive the gate. This effectively pushes the gate pole out to a higher frequency (1 decade per 20 dB of loop gain of the feedback amplifier). The feedback amplifier is designed for very high slew rate while running at very low quiescent current. The circuit enhances the LDO performance, stability, and slew rate.

Figure 1:
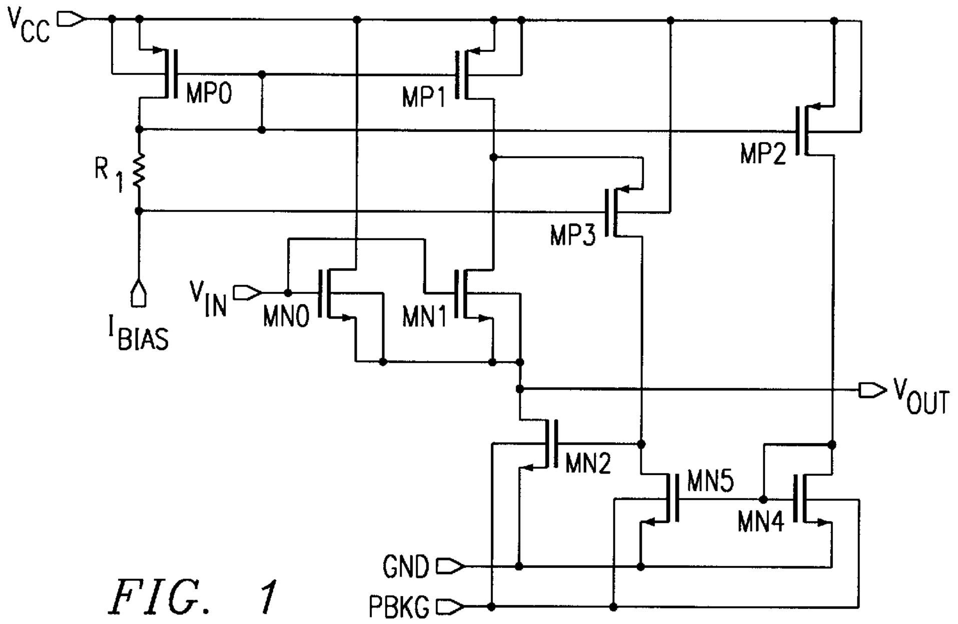
FIG. 1 is a schematic circuit diagram of a preferred embodiment driver circuit.

FIG. 1 is a diagram of the preferred embodiment driver circuit. Bias current Ibias flows through resistor R1 and is mirrored from MP0 to MP1 and MP2. The current sourced by MP2 L5 flows into MN4, and is mirrored by MN5. The current sunk by MN5 must flow through MP3, and must come from MP1. Care is taken to insure that the current sunk by MN5 is less than the current that is supplied by MP1, and the residual current from MP1 must flow through MN1 into MN2. MN0 mirrors MN1, so the current through MN0 and MN1 are identical. Care is taken that the voltage drop across resistor R1 is large enough to keep MP1 in the saturation region.

The feedback control loop can be traced from MN1 to MP3 to MN2, then back to MN1. The input is provided at node Vin and the output at node Vout. The source voltage is provided at node Vcc and ground is at node gnd. The backgate node PBKG is coupled to the back gates of transistors MN2, MN4, and MN5.

Figure 2:
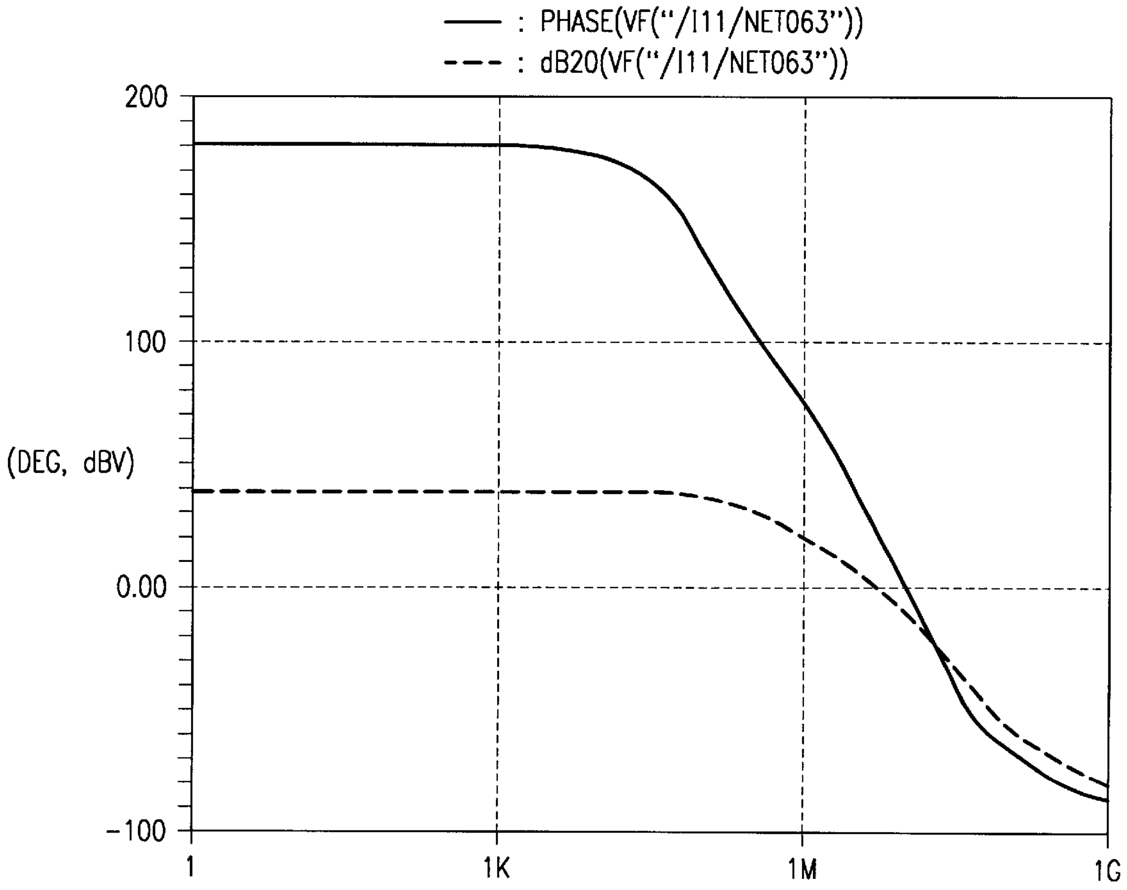
FIG. 2 is a graph of the open loop AC gain and phase response of the circuit of FIG. 1.

FIG. 2 shows the open loop AC gain and phase response of the feedback loop. The total bias current is 8 $\mu$A, and the load capacitance is 100 pF. The phase margin is approximately 25 degrees.

Figure 3:
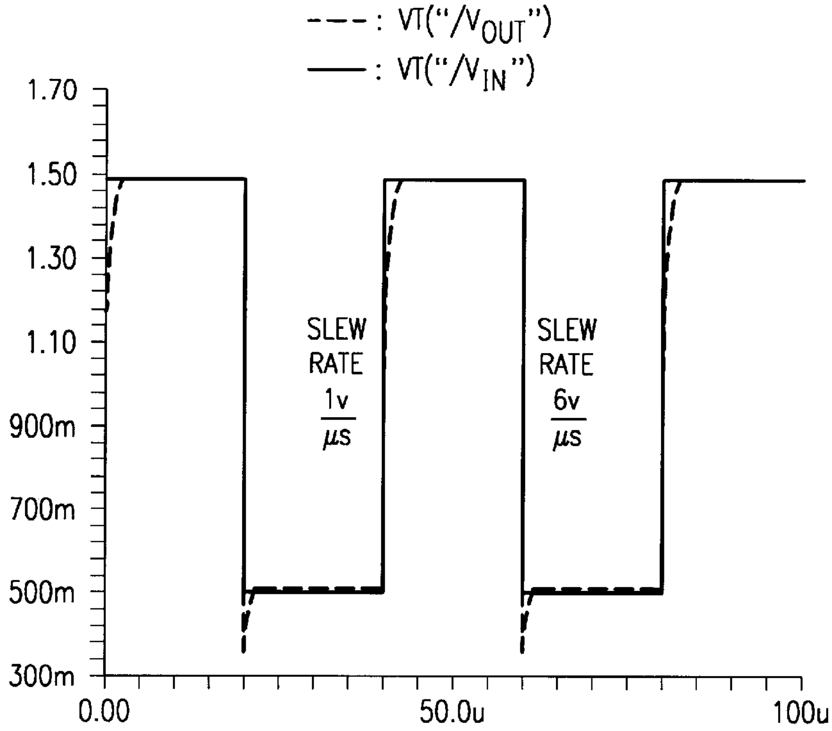
FIG. 3 is a graph of the transient response of the preferred embodiment driver of FIG. 1 under the same bias and loading conditions of FIG. 2.

FIG. 3 shows the transient response of the preferred embodiment driver under the same bias and loading conditions of FIG. 2. The rising slew rate is approximately 1 V/$\mu$s, and the falling slew rate is approximately 6 V/$\mu$s. A standard source (emitter) follower would require 100 uA of quiescent current to achieve 1 V/$\mu$s slew rate under this loading condition.

Figure 4:
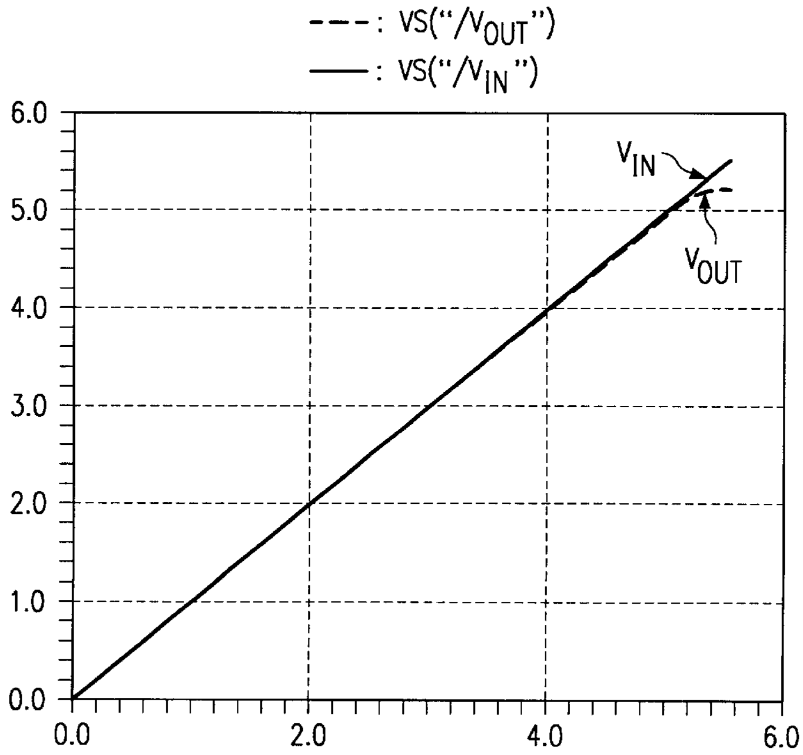
FIG. 4 is a graph of the DC transfer characteristics of the driver circuit of FIG. 1.

FIG. 4 describes the DC transfer characteristics of the buffer. The output common mode range is limited only by the threshold voltage of MN0.

Figure 5:
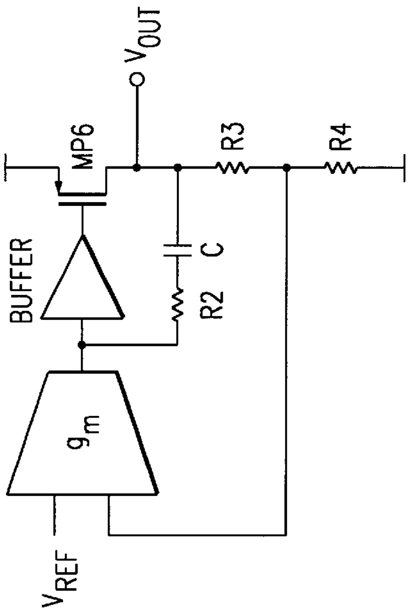
FIG. 5 is a block diagram showing the circuit of FIG. 1 implemented in a low dropout regulator.

FIG. 5 is a block diagram describing how the buffer circuit of FIG. 1 may be implemented in an LDO. A transconductance amplifier gm drives the input of the buffer, and the buffer drives the PMOS pass transistor MP6. RC compensation from resistor R2 and capacitor C is included for completeness. Resistors R3 and R4 provide the voltage divider feedback for the LDO. The regulated output voltage is provided at node Vo.

Figure 6:
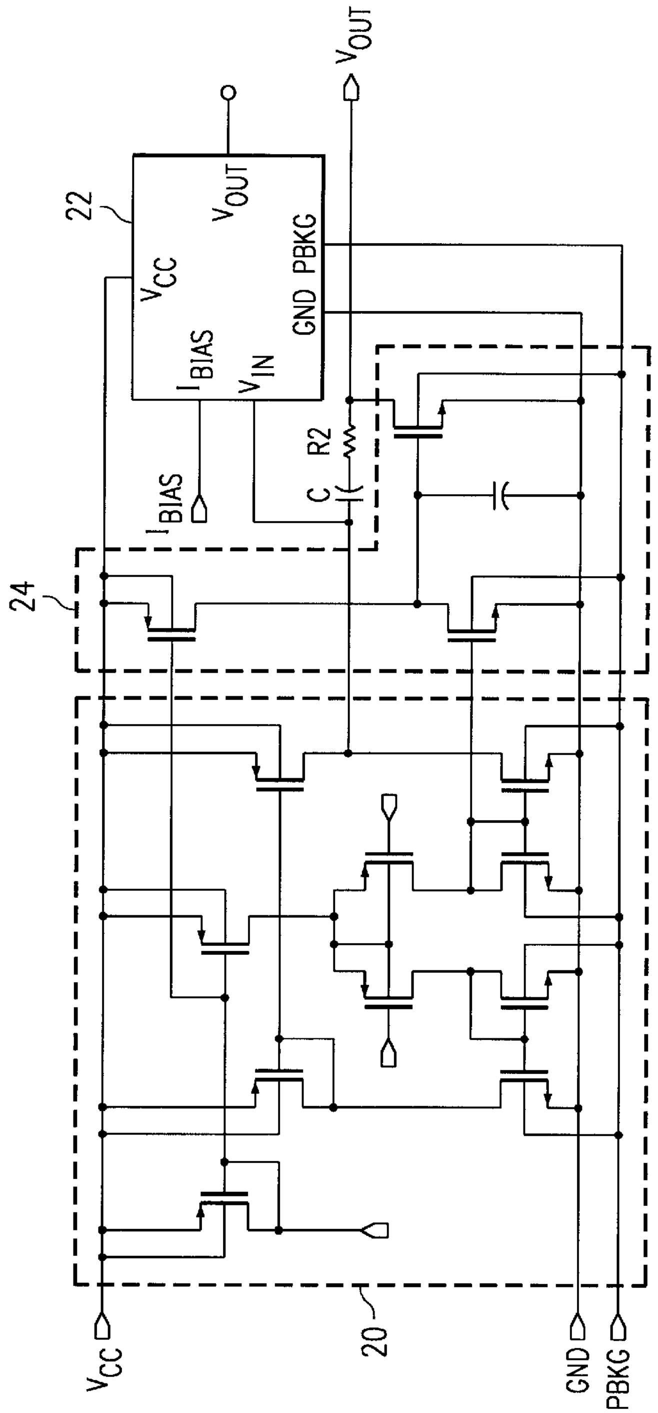
FIG. 6 is a schematic circuit diagram of an implementation of a low dropout regulator that uses the drive circuit of FIG. 1.

FIG. 6 is a circuit diagram of one possible implementation of an LDO that uses the drive circuit of FIG. 1. Circuit 20 is the amplifier gm of FIG. 5. Drive circuit 22 is the buffer circuit of FIG. 5 which is the circuit of FIG. 1. Transistor MP6 and resistors R3 and R4 of FIG. 5 are not shown in FIG. 6. Fast transient circuitry 24 is included in this example.

Figure 7:
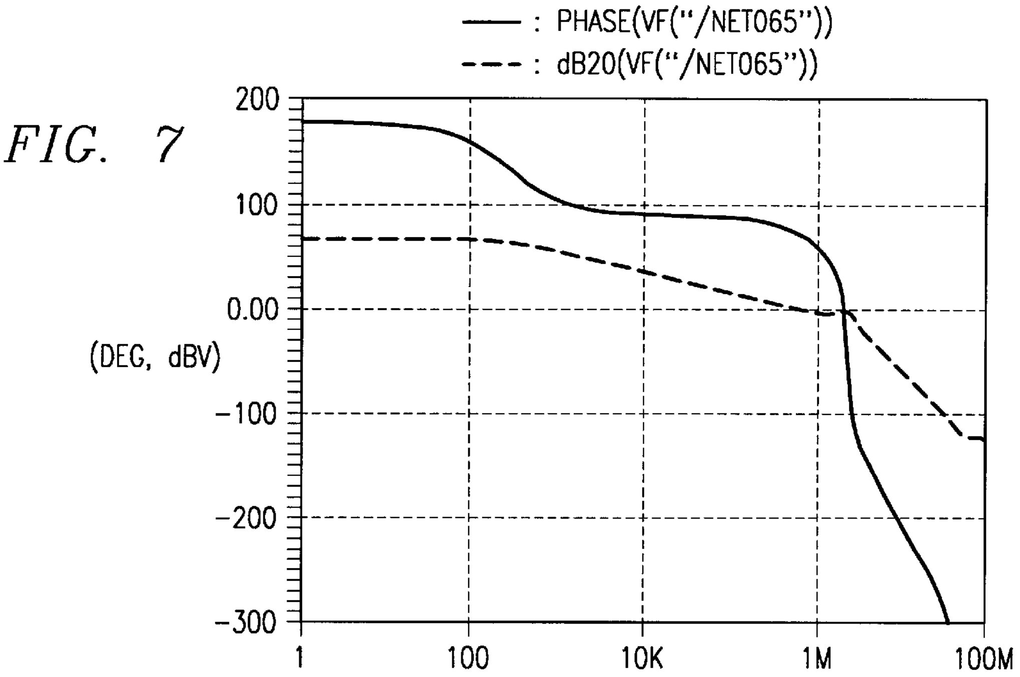
FIG. 7 is a graph of the open loop AC gain and phase response of the circuit of FIG. 6 with a 200 mA load.

FIG. 7 shows the open loop AC gain and phase response of the LDO of FIG. 6 with a 200 mA load. The slight peaking in the response in the proximity of 5 MHz is due to the closed loop response of the buffer (25 degrees of phase margin).

Figure 8:
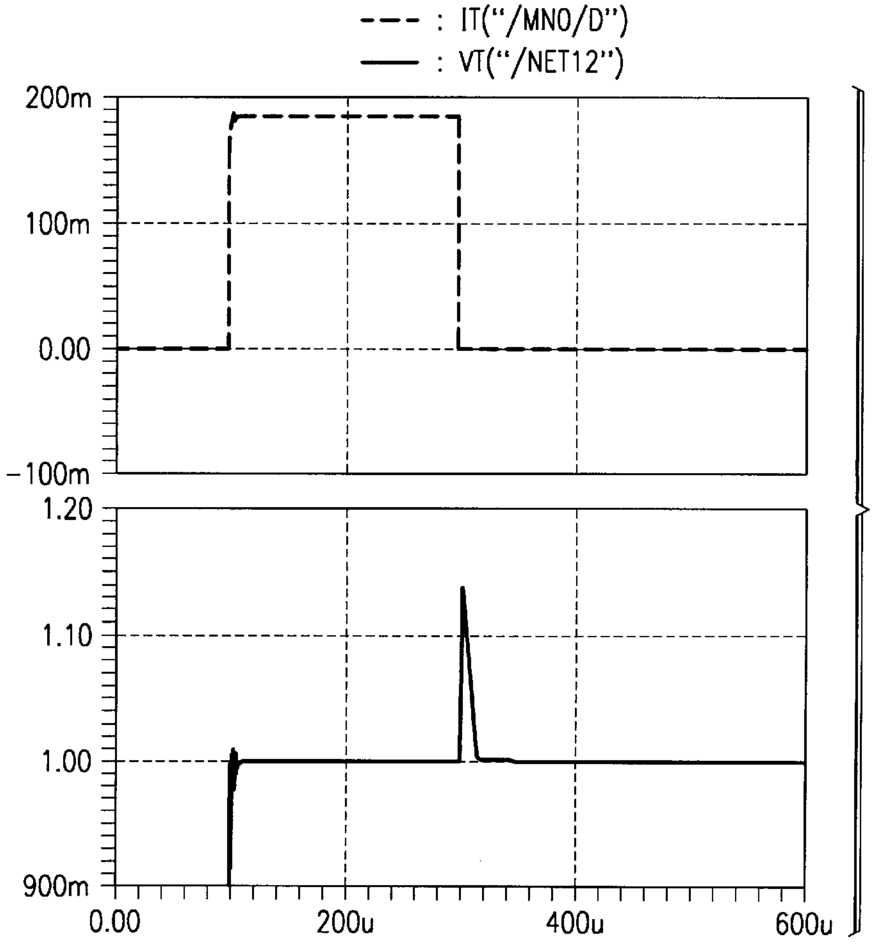
FIG. 8 is a graph of the transient response of the circuit of FIG. 6.

FIG. 8 shows the transient response of the LDO of FIG. 6, as load current is changed from 0 mA to 0.2 A, and back to 0 mA again. The overshoot seen on the high load to low load transition is due to the chosen compensation method.

An advantage of the preferred embodiment is that it pushes the gate pole out to a sufficiently high frequency so as to have negligible adverse effects on the in-band frequency response of the circuit without using a large quiescent current and without compromising slew-rate performance while maintaining a relatively simple topology. This is accomplished by using a relatively simple feedback circuit that achieves very high slew rate without increasing bias currents.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. For example, the use of the preferred embodiment buffer/driver circuit is not limited to low dropout regulators. It can be used in any amplifier that has an internal node that has a large capacitance, or is slew rate limited. It is therefore intended that the appended claims encompass any such modifications or embodiments.

What is claimed is:

1. A circuit comprising:

an amplifier;

an output transistor;

a first transistor coupled to a gate of the output transistor and having a control node coupled to an output of the amplifier;

a second transistor coupled to the gate of the output transistor and having a control node coupled to the output of the amplifier;

a third transistor coupled to the gate of the output transistor; and a fourth transistor having one end coupled to a control node of the third transistor and a second end coupled to the second transistor.

2. The circuit of claim 1 further comprising a fifth transistor coupled to the second and the fourth transistor.

3. The circuit of claim 2 further comprising a sixth transistor coupled to a control node of the fifth transistor such that a current in the sixth transistor is mirrored in the fifth transistor.

4. The circuit of claim 3 further comprising a bias current node coupled to the sixth transistor.

5. The circuit of claim 4 further comprising a seventh transistor coupled to the fourth transistor.

6. The circuit of claim 5 further comprising an eighth transistor coupled to a control node of the seventh transistor such that a current in the eighth transistor is mirrored in the seventh transistor.

7. The circuit of claim 6 further comprising a ninth transistor coupled to the eighth transistor and having a control node coupled to the sixth transistor such that the current in the sixth transistor is mirrored in the ninth transistor.

8. The circuit of claim 1 further comprising a resistor feedback circuit coupled between the output transistor and an input of the amplifier.

9. The circuit of claim 8 wherein the resistor feedback circuit comprises a first resistor coupled in series with a second resistor and the input of the amplifier coupled to a node between the first and second resistors.

10. The circuit of claim 1 further comprising an RC circuit coupled between the output transistor and the output of the amplifier.

* * * * *